(12) United States Patent
Gyoda (10) Patent No.: US 8,986,912 B2
(45) Date of Patent: Mar. 24, 2015

(54) METHOD FOR GENERATING MASK PATTERN

(71) Applicant: Canon Kabushiki Kaisha, Tokyo (JP)

(72) Inventor: Yuichi Gyoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 30 days.

(21) Appl. No.: 13/835,165

(22) Filed: Mar. 15, 2013

(65) Prior Publication Data

US 2013/0266893 A1 Oct. 10, 2013

(30) Foreign Application Priority Data

Apr. 4, 2012 (JP) ................. 2012-085723

(51) Int. Cl.
G03F 1/70 (2012.01)
(52) U.S. Cl.
CPC ........................................ G03F 1/70 (2013.01)
USPC ................................................ 430/5; 716/50
(58) Field of Classification Search
CPC ........................................................ G03F 1/70
USPC ................................................ 430/5; 716/50
See application file for complete search history.

(56) References Cited

U.S. PATENT DOCUMENTS

| 7,979,812 B2 | 7/2011 | Jung |
| 8,099,684 B2 | 1/2012 | Meiring |
| 2010/0009272 A1 | 1/2010 | Kawashima |
| 2010/0021825 A1 | 1/2010 | Kodama |

FOREIGN PATENT DOCUMENTS

| CN | 101228478 A | 7/2008 |
| CN | 101378009 A | 3/2009 |
| JP | 2003-186174 A | 7/2003 |
| JP | 2009093138 A | 4/2009 |

*Primary Examiner* — Christopher Young

(74) *Attorney, Agent, or Firm* — Canon USA, Inc., IP Division (57) ABSTRACT

A method for generating, via a computer, a mask pattern to be used for an exposure apparatus that exposes an image of the mask pattern on a substrate by irradiating a mask includes obtaining data of a main pattern to be formed on the substrate, and data of a pattern of a lower layer of a layer to which the main pattern is transferred, setting a generation condition for an auxiliary pattern with respect to the main pattern using data of the pattern of the lower layer, determining the auxiliary pattern using the generation condition, and generating data of the mask pattern including the main pattern and the determined auxiliary pattern.

11 Claims, 10 Drawing Sheets

METHOD FOR GENERATING MASK PATTERN

BACKGROUND OF THE INVENTION

1. Field of the Invention

The present invention relates to a method for generating a mask pattern.

2. Description of the Related Art

According to miniaturization of a semiconductor device in recent years, it is difficult to transfer a micromask pattern of a mask using an exposure apparatus. Therefore, a technology that performs an optical proximity correction (OPC) on the mask pattern or provides an auxiliary pattern to improve a resolving property of the mask pattern is known. Here, the resolving property refers to a property regarding resolution, such as a contrast of an image, a normalized image log slope (NILS), a depth of focus, a process window, an exposure margin. The auxiliary pattern is also referred to as an assist feature (AF), a sub-resolution assist feature (SRAF), or a scattering bar (SB). The auxiliary pattern is provided separately from a main pattern to improve the resolving property of a main pattern to be transferred to a wafer.

Japanese Patent Application Laid-Open No. 2009-093138, U.S. Pat. Nos. 7,979,812 and 8,099,684 discuss a determining method for an auxiliary pattern. Japanese Patent Application Laid-Open No. 2009-093138 discusses a method for determining a position of an auxiliary pattern using an approximate aerial image. Japanese Patent Application Laid-Open No. 2009-093138 does not discuss whether to transfer the auxiliary pattern itself. U.S. Pat. No. 7,979,812 discloses a method for, when an auxiliary pattern is transferred to a wafer after OPC, performing the OPC again around an area, on which the auxiliary pattern is to be transferred, and determining the auxiliary pattern so as not to completely transfer the auxiliary pattern. U.S. Pat. No. 8,099,684 discusses a method for determining an auxiliary pattern, which is used for first exposure, in double exposure, to transfer the auxiliary pattern to a wafer in the first exposure but removes the transferred auxiliary pattern by second exposure.

In the invention discussed in U.S. Pat. No. 7,979,812, a main pattern to be transferred to a wafer is transferred but an auxiliary pattern is limited so as not to be completely transferred, so that an effect of improving a resolving property of the main pattern by the auxiliary pattern is limited. According to a review of the present inventors, if a size of the auxiliary pattern is increased, the resolving property of the main pattern is improved in many cases. However, if the size of the auxiliary pattern is too large, the auxiliary pattern itself is transferred to the wafer as discussed in U.S. Pat. No. 8,099,684.

Here, it is assumed that a pattern is transferred by exposure to a wafer having a laminated structure, in which a pattern is already formed on a lower layer and a resist is applied thereon, and processing is performed on the pattern on the lower layer using the transferred pattern as a mask (a cover layer). In this case, if the auxiliary pattern is transferred by the exposure, the lower layer is processed according to a shape or a position of the transferred auxiliary pattern. If a part of the lower layer which is processed by the auxiliary pattern coincides with a part which should not be processed, that results in a defect due to a structure of the pattern of the lower layer, and may be a problem. However, if the part of the lower layer which is processed by the auxiliary pattern does not coincide with the part which should not be processed, there may not be a problem in some cases. In other words, depending on the relationship between the position of the pattern of the lower layer and a transfer position of the auxiliary pattern, even though the auxiliary pattern is transferred, there may not be a problem.

In the invention discussed in U.S. Pat. No. 8,099,684, even though the auxiliary pattern is transferred by the first exposure, the auxiliary pattern does not remain on the wafer while being transferred thereto by performing double exposure, so that it is not assumed that the pattern of the lower layer is processed by the auxiliary pattern. In other words, the auxiliary pattern is determined without considering the pattern of the lower layer.

As described above, in related art, when the auxiliary mask pattern is determined, a method for generating the auxiliary pattern while considering the relationship between the position of the pattern of the lower layer and the transfer position of the auxiliary pattern has not been known.

SUMMARY OF THE INVENTION

The present invention is directed to a method for generating a mask pattern, which improves a resolving property of a main pattern.

According to an aspect of the present invention, a method for generating, via a computer, a mask pattern to be used for an exposure apparatus that exposes an image of the mask pattern on a substrate by irradiating a mask includes obtaining data of a main pattern to be formed on the substrate, and data of a pattern of a lower layer of a layer to which the main pattern is transferred, setting a generation condition for an auxiliary pattern with respect to the main pattern using data of the pattern of the lower layer, determining the auxiliary pattern using the generation condition, and generating data of the mask pattern including the main pattern and the determined auxiliary pattern.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

The exemplary embodiment of the present invention may be applied to manufacture various devices, such as a semiconductor chip such as an integrated circuit (IC) and a large-scale integration (LSI), a display element for a liquid crystal panel, a detecting element for a magnetic head, an imaging element such as a charge-coupled device (CCD) sensor, or to generate data of a mask (disk) pattern which is used in micromechanics.

Figure 1:
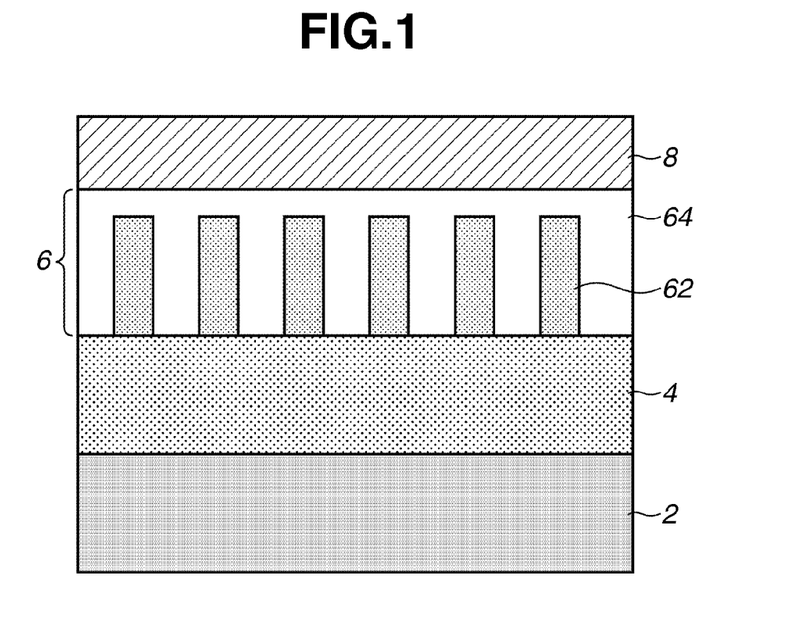
FIG. 1 is a view illustrating an example of a laminated structure of a substrate.

FIG. 1 illustrates an example of a laminated structure of a wafer (a substrate) to be exposed in the exemplary embodiment. An etching layer 2, a hard mask layer 4, a pattern layer 6, and a photosensitive material (a resist) 8 are laminated on a wafer which is not illustrated. In the pattern layer 6, a pattern 62 which has been already formed and an antireflection film (a bottom-antireflection coating (BARC)) 64 are formed.

A pattern forming process will be described. First, in an exposure process, a mask is irradiated using an exposure apparatus, and a latent image of a mask pattern is formed on a photosensitive material 8. Here, it is assumed that a light transmittance of a material for the mask is 100% and a light transmittance of a pattern portion on the mask is low (for example, 0%). Such a mask may be referred to as a bright field mask because a background of the mask is bright. Then, the latent image formed on the photosensitive material 8 is developed. If the photosensitive material 8 is a positive type, a portion which is exposed with an exposure amount equal to or larger than a predetermined threshold value is removed by the development, so that a photosensitive material which is on the pattern portion (a dark portion) on the mask remains. For example, if the pattern (the dark portion) on the mask is a pattern 200, an isolated pattern remains as a dot, which is referred to as a left-over pattern (a line pattern). In contrast, if the photosensitive material 8 is a negative type, a portion which is not exposed with an exposure amount equal to or larger than the predetermined threshold value is removed by the development, so that a photosensitive material which is in a background portion (a bright portion) on the mask remains. For example, if the pattern (the dark portion) on the mask is the pattern 200, an isolated pattern is removed to form a hole shape, which is referred to as a punching pattern (a space pattern). Recently, a method that switches the type of developing solution to perform the development reversely as described above is developed. Such a development process is referred to as negative development (the above-described development is positive development). In other words, a pattern finally obtained by performing the negative development on a positive type photosensitive material is substantially equal to a pattern finally obtained by performing the positive development on a negative type photosensitive material.

As described above, the mask pattern is transferred to the photosensitive material 8 by the development. Then, the pattern layer 6 which is a lower layer is processed based on the pattern of the photosensitive material 8 formed as described above. For example, if the photosensitive material 8 is a negative type, a part of the pattern 62 is removed from the remaining portion by the development process.

Figure 2A:
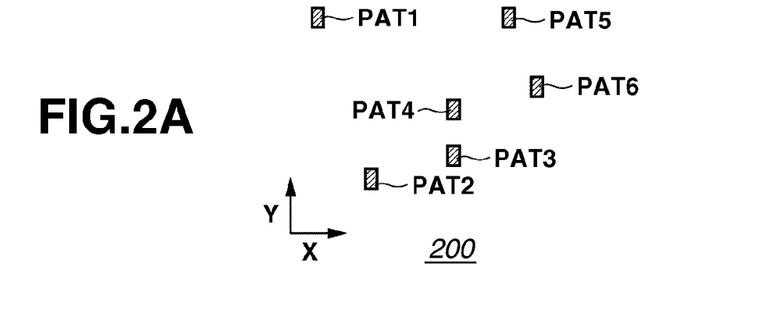
FIG. 2A is a view illustrating a main pattern.
Figure 2B:
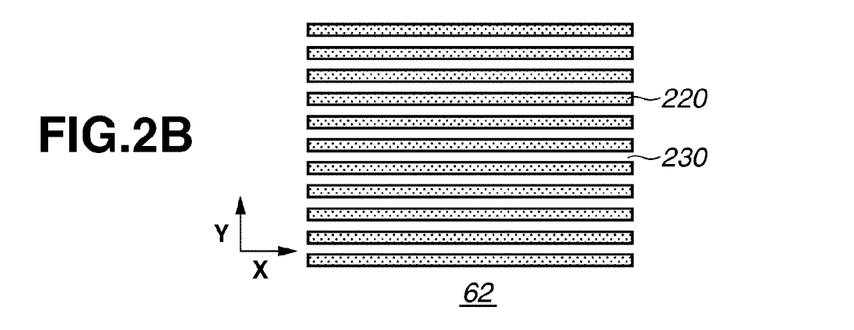
FIG. 2B is a view illustrating a pattern of a lower layer.
Figure 2C:
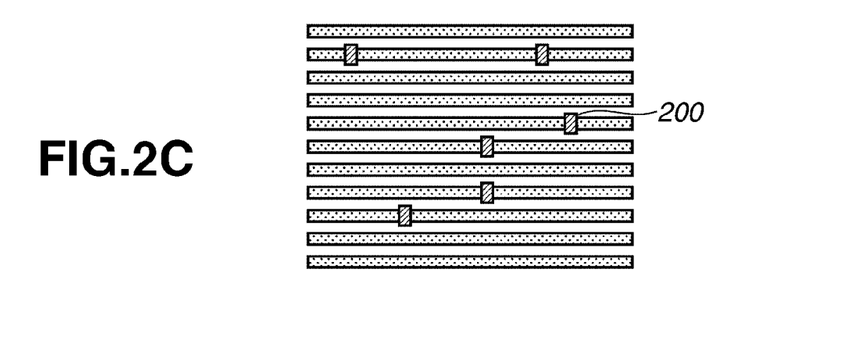
FIG. 2C is a view illustrating a position of the main pattern and the pattern of the lower layer.
Figure 2D:
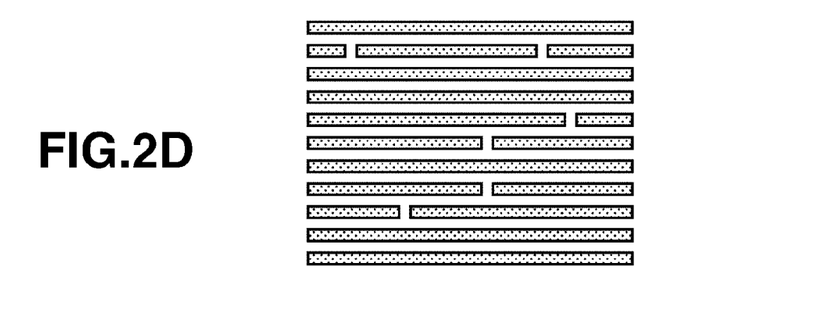
FIG. 2D is a view illustrating a processed pattern of the lower layer.

A specific example will be described with reference to FIGS. 2A, 2B, 2C, and 2D. FIG. 2A is a plan view illustrating the pattern (a main pattern) 200 of a mask to be transferred to the photosensitive material (the substrate) 8. FIG. 2B is a plan view illustrating the pattern 62 formed on the pattern layer 6. The pattern 62 is a line and space (an L/S pattern), in which line parts 220 and space parts 230 are alternately disposed. FIG. 2C is a plan view illustrating positions of the pattern 62 and the pattern 200 of the mask transferred to the photosensitive material 8. As illustrated in FIG. 2C, when the pattern 200 of the mask is transferred to the photosensitive material 8, the pattern 200 of the mask overlaps parts of the line parts 220 in the pattern 62. If the photosensitive material 8 is a negative type, or, if the photosensitive material 8 is a positive type and development process is the negative development, the punching pattern is formed as described above. In other words, in the processing process of the pattern layer 6, the line parts 220 are removed from the overlapping portion and the line parts 220 are divided as illustrated in FIG. 2D. The pattern 200 of the mask illustrated in FIG. 2A has a function to cut the line parts 220, so that the pattern 200 may be referred to as a cut pattern in some cases. Further, similarly to the example, the pattern is formed as illustrated in FIG. 2D instead of using a two-dimensional pattern, which extends in two directions such as an L-shaped pattern or a U-shaped pattern, so that the pattern may be referred to as a one-dimensional arrangement or a 1D layout. A device manufacturing method by the one-dimensional layout is applied to a commercially available semiconductor logic device and also applied to a gate process or a metal process of a static random access memory (SRAM) in many cases. Thus, the device manufacturing method by the one-dimensional layout is sufficiently understandable by a person in the art.

Figure 3:
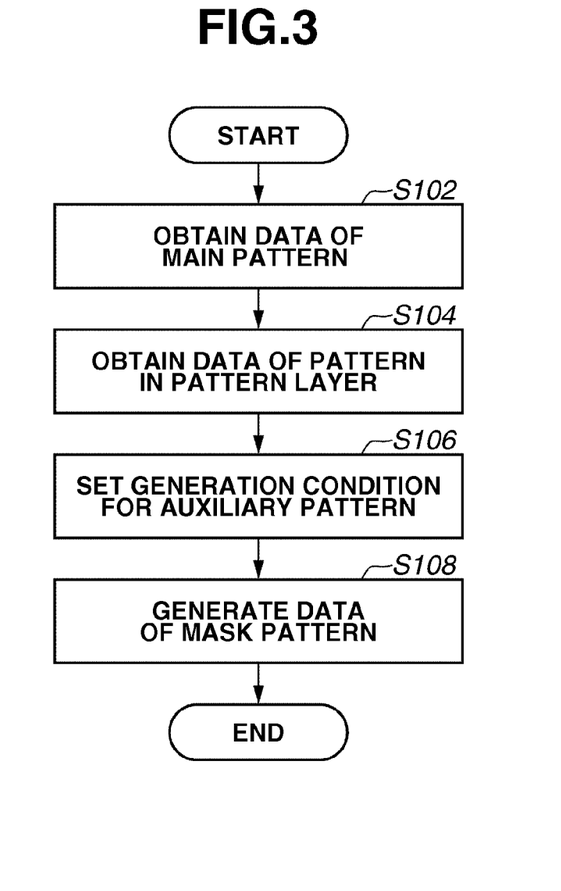
FIG. 3 is a flowchart illustrating a pattern generating method according to an exemplary embodiment of the present invention.

A mask pattern generating method will be described. FIG. 3 is a flowchart illustrating the mask pattern generating method according to the exemplary embodiment. Such a generating method is performed by an information processing apparatus such as a computer to generate data of a mask pattern, which is used for an exposure apparatus including a projection optical system which projects an image of the mask pattern including a main pattern and an auxiliary pattern onto a substrate.

Further, in the exemplary embodiment, a size on an object surface of the projection optical system is equal to a size of an image on an image surface of the projection optical system (that is, a magnifying power of the projection optical system is one magnification). However, actually, the magnifying power of the projection optical system is four magnifications or five magnifications in many cases, so that the mask pattern needs to be set in consideration of the magnifying power of the projection optical system.

In step S102, data of the main mask pattern, which needs to be disposed on the object surface of the projection optical system of the exposure apparatus, is obtained. The data of the main pattern is a designed value, which is designed in a design process of the mask pattern. The main pattern is a pattern which is directed to be transferred to the wafer. Here, when the pattern illustrated in FIG. 2A is set as one unit (a repeating unit), a designed value of the main pattern is 600 nm in the X direction and 550 nm in the Y direction and periodically arranged. The pattern illustrated in FIG. 2A includes six isolated patterns (figures) of patterns PAT1 to PAT6. A relative position of the patterns PAT1 to PAT6 will be indicated in Table 1. A size of the each of the patterns PAT1 to PAT6 is 32 nm in the X direction and 50 nm in the Y direction. The mask is a binary mask.

TABLE 1

|      | Position |        |
| ---- | -------- | ------ |
|      | X [nm]   | Y [nm] |
| PAT1 | 60       | 450    |
| PAT2 | 180      | 100    |
| PAT3 | 360      | 150    |
| PAT4 | 360      | 250    |
| PAT5 | 480      | 450    |
| PAT6 | 540      | 300    |

Then, in step S104, data of the pattern 62 in the pattern layer 6 below the photosensitive material 8 is obtained. The data of the pattern 62 may be a designed value, which is designed in the design process of the mask pattern, or actually measured data. Here, the data of the pattern illustrated in FIG. 2B is set as the designed value of the pattern 62. The pattern 62 is configured by the line parts 220 and the space parts 230 which extend in the X direction. The line parts 220 with a width of 25 nm in the Y direction are disposed parallel to each other with a pitch of 50 nm. As described above, the pattern illustrated in FIG. 2B is processed according to the pattern illustrated in FIG. 2A to form the pattern illustrated in FIG. 2D.

Then, in step S106, a generation condition for the auxiliary pattern to improve the resolving property of the main pattern input in step S102 is set. The generation condition is set using data of the pattern 62 in the pattern layer 6 below the photosensitive material 8. The following generation condition is set under the assumption that the pattern 62 in the pattern layer 6 is removed from a part of the transferred pattern on a layer of the photosensitive material 8. In other words, on the layer of the photosensitive material 8, the generation condition is set such that the auxiliary pattern may be transferred on the space part 230 of the pattern illustrated in FIG. 2B but the auxiliary pattern is not allowed to be transferred on the line parts 220 other than a portion onto which the main pattern is transferred. This is because, even though the auxiliary pattern is transferred on the space parts 230, the line parts 220 are not cut and the electric property of the line parts 220 is not adversely affected.

Figure 4A:
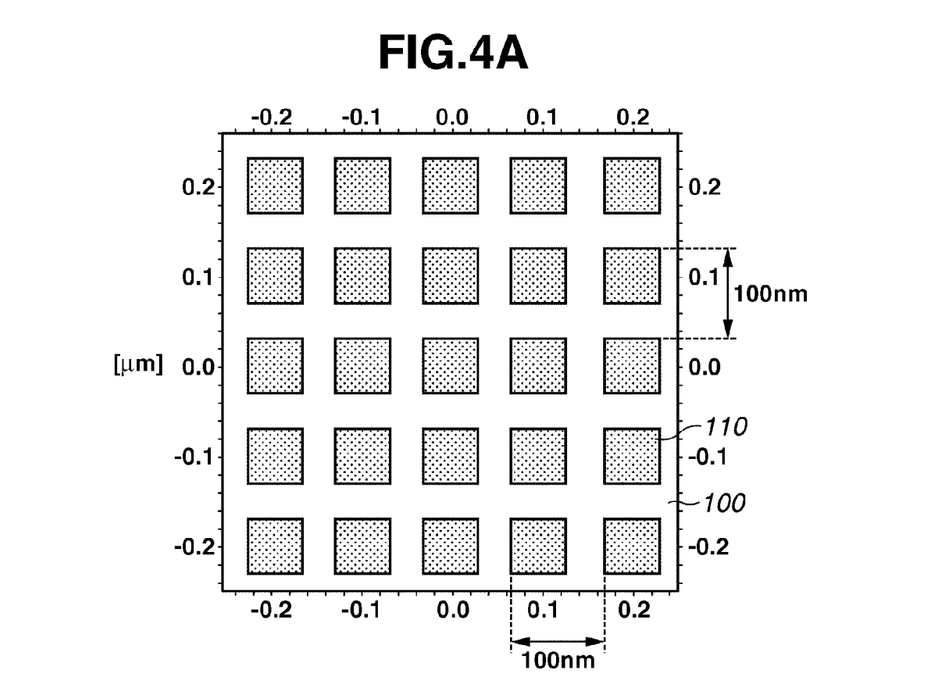
FIG. 4A is a view illustrating a mask pattern for explaining a resolving property of a pattern and FIG. 4B is a view illustrating the pattern and an image thereof.

Further, in the related art which is represented by U.S. Pat. No. 7,979,812, information of the pattern of the lower layer is not considered and the auxiliary pattern is not allowed to be transferred onto any positions. Therefore, the effect of the improvement of the resolving property of the main pattern by the auxiliary pattern is limited. The resolving property will be described with a specific example. FIG. 4A illustrates the mask pattern. Isolated patterns 110 having a light transmittance of 0% are periodically disposed in the horizontal and vertical directions with an interval of 100 nm on a mask 100 having a light transmittance of 100%. In the example, the isolated pattern is a main pattern, which needs to be transferred to the wafer, but an auxiliary pattern which improves the resolving property of the isolated pattern is not provided. Each of the isolated patterns is a square. Further, even though five isolated patterns are arranged in the respective vertical and horizontal directions in FIG. 4A, the following calculation is performed under the condition assuming that, actually, the isolated patterns are infinitely arranged.

Figure 4B:
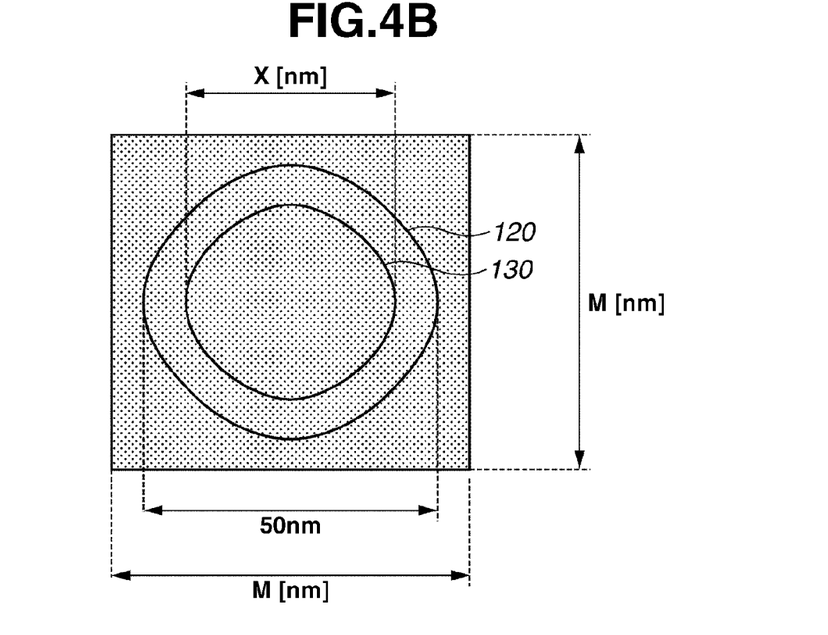

For the mask pattern in FIG. 4A, an exposure condition of an annular illumination is set such that a wavelength of a light source is 193 nm, a numerical aperture (NA) on an emitting side of the projection optical system is 1.35, and an illumination shape (distribution of optical intensity on a pupil plane of an illumination optical system) has an outer sigma (an outer diameter) of 0.98 and an inner sigma (an inner diameter) of 0.784 (when a maximum diameter of the pupil plane is 1). FIG. 4B illustrates a simulation result of an image which is formed on an image surface under the exposure condition. Generally, if the exposure amount is changed, a size of the image is changed. Therefore, in the simulation, a reference exposure amount is set such that a diameter of a hole-shaped image of the isolated pattern is 50 nm in a reference focal position. A boundary line (an edge) of the image calculated with the reference exposure amount is a curve 120.

Further, a simulation in which an exposure process change (a process error) during the exposure is considered is performed. In the example, the calculation is performed under an assumption that an error occurs in a size of the isolated pattern, the exposure amount, and the focal position. Specifically, it is assumed that the size of the isolated pattern is 2 nm smaller, the reference exposure amount is increased by 5%, and the focal position is shifted by 20 nm from the reference focal position. A curve 130 is a boundary line of the image when three exposure process changes simultaneously occur. In addition, all of the error values which are applied to the size of the isolated pattern, the exposure amount, and the focal position are factors which work to reduce the size of the image. Therefore, even when these error values are simultaneously considered, there is no problem in the evaluation.

Figure 5:
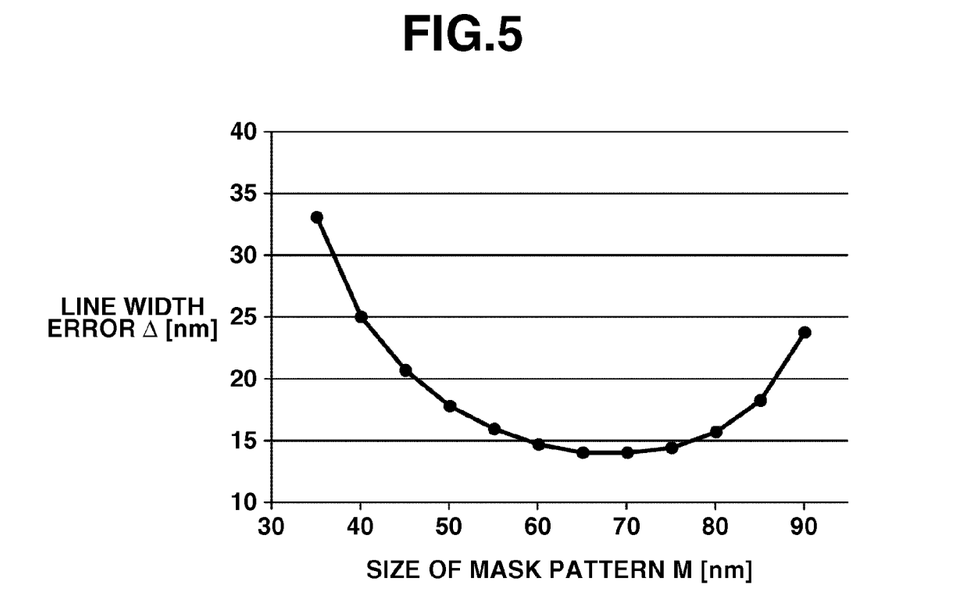
FIG. 5 is a graph illustrating a relationship between a size of a mask pattern and a line width error.

When a width (a diameter) of a figure enclosed by the curve 130 is X nm, a line width error $\Delta$ is expressed by a difference from a width (a diameter) of a figure enclosed by the curve 120 of 50 nm, that is, the value $\Delta=50-X$ nm. It is desirable that the value $\Delta$ is small since the pattern becomes insensitive to the change of the exposure process. When the size of the isolated pattern is used as a variable M, a relationship between M and the line width error $\Delta$ is illustrated in FIG. 5. As seen from FIG. 5, the line width error $\Delta$ has a minimum value when M is approximately 70 nm. In other words, when a pattern having a size larger than 50 nm, which is a target size, is used as a mask pattern, the pattern is insensitive to the change of the exposure process.

Further, even though various patterns may be used as a pattern for an actual device, like the simple isolated pattern described in the exemplary embodiment, the fact that a pattern becomes insensitive to the change of the exposure process when the mask pattern is formed to be larger than the target size may be applied to many patterns. In addition, similarly, in the auxiliary pattern, if the size of the auxiliary pattern is increased together with the main pattern, the resolving property of the main pattern is improved in many cases.

However, if the size of the auxiliary pattern is increased, the auxiliary pattern itself is more likely to be transferred to the wafer. Due to the structure of the device, if the auxiliary pattern is transferred in a location which may cause a defect, that results in the lowering of the manufacturing yield of the device.

Therefore, in the exemplary embodiment, using information on the pattern of the lower layer of the photosensitive material, as described above, the generation condition for the auxiliary pattern is set and the auxiliary pattern is allowed to be transferred in a specific position. That improves the resolving property of the main pattern as compared with the related art. Even though the auxiliary pattern is transferred to the space parts 230, the line parts 220 are not cut and the electric property of the line part 220 is not adversely affected. Consequently, the lowering of the manufacturing yield of the device is suppressed.

Figure 6:
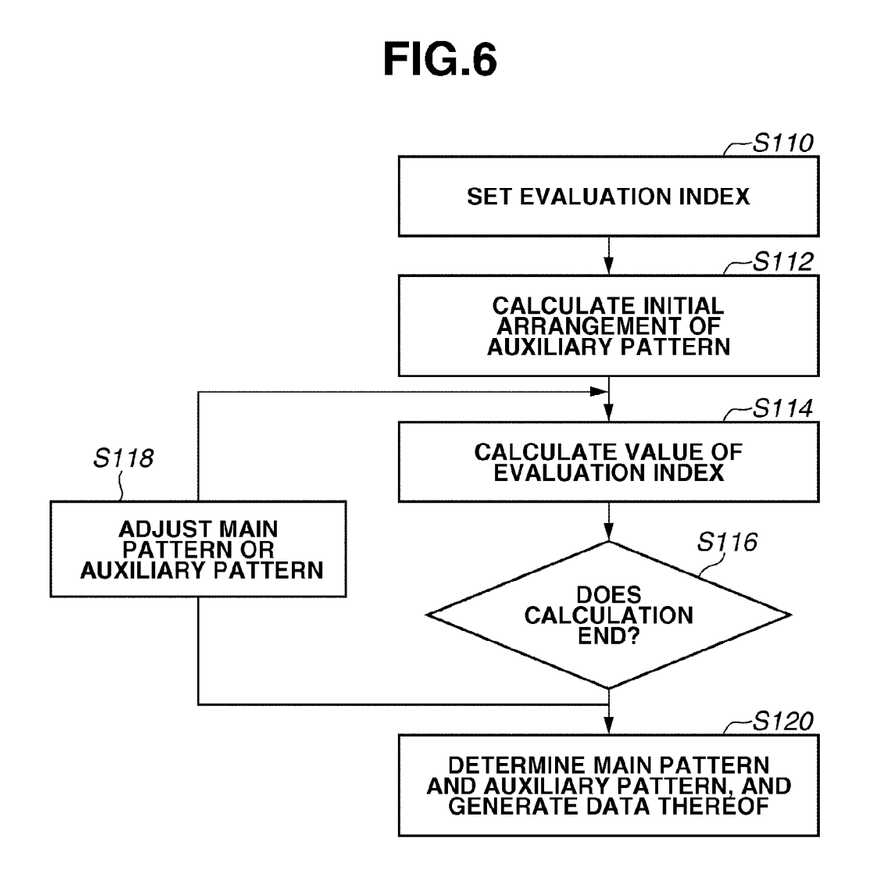
FIG. 6 is a detailed flowchart illustrating step S108.

Then, in step S108, data of the mask pattern is generated using the generation condition set in step S106. FIG. 6 illustrates a detailed flow of step S108.

First, in step S110, an evaluation index is set. In an optimization calculation, generally, algorithm, which changes a value of a parameter to be adjusted according to change of a value of a merit function, is used. The merit function is referred to as an optimization cost or metric in some cases. In the exemplary embodiment, a maximum line width error at the time of the exposure process change is set as the merit function. 18 conditions which are indicated in Table 2 are set as the exposure process. A mask error (a size error of the pattern), a focal position error, and an exposure amount error at the time of exposure are set to be different values in each condition.

TABLE 2

| CONDITION | MASK ERROR [nm] | FOCAL POSITION ERROR [nm] | EXPOSURE AMOUNT ERROR [nm] |
| --- | --- | --- | --- |
| 1 | 0 | 0 | 0 |
| 2 | 0 | 0 | +4% |
| 3 | 0 | 0 | −4% |
| 4 | 0 | +20 nm | 0 |
| 5 | 0 | +20 nm | +4% |
| 6 | 0 | +20 nm | −4% |
| 7 | +2 nm | 0 | 0 |
| 8 | +2 nm | 0 | +4% |
| 9 | +2 nm | 0 | −4% |
| 10 | +2 nm | +20 nm | 0 |
| 11 | +2 nm | +20 nm | +4% |
| 12 | +2 nm | +20 nm | −4% |
| 13 | −2 nm | 0 | 0 |
| 14 | −2 nm | 0 | +4% |
| 15 | −2 nm | 0 | −4% |
| 16 | −2 nm | +20 nm | 0 |
| 17 | −2 nm | +20 nm | +4% |
| 18 | −2 nm | +20 nm | −4% |

Further, when the auxiliary pattern is transferred on the line parts 220 other than a portion to which the main pattern is transferred, an abnormal value having a very large value, or the like, is generated in the merit function and thus an abnormal state is evaluated using the merit function. In this case, if the auxiliary pattern is transferred on the line part 220 other than a portion on which the main pattern is transferred, information indicating the abnormal state may be set to be generated, and the merit function and abnormal state information may be set as the evaluation index. In other words, the evaluation index is set based on the generation condition set in step S106.

Figure 7:
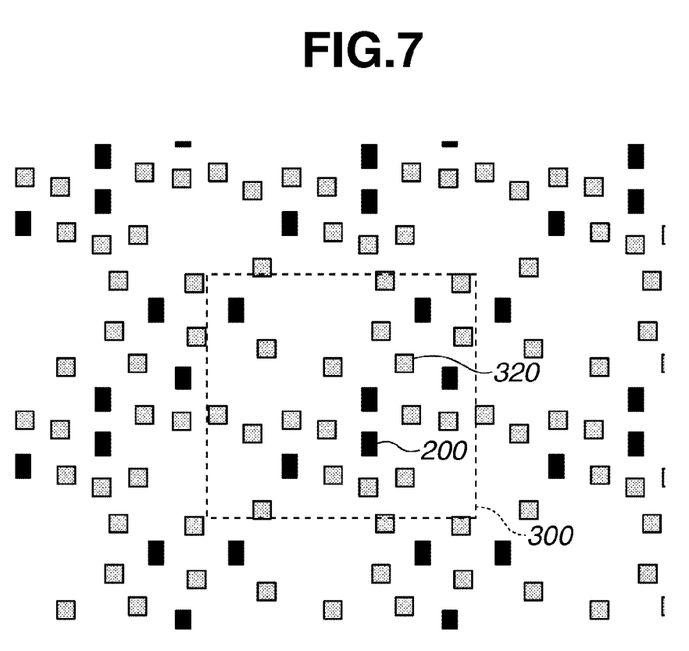
FIG. 7 is a view illustrating an initial arrangement of the main pattern and an auxiliary pattern.

Then, in step S112, an initial arrangement of the auxiliary patterns is calculated. In the exemplary embodiment, the calculation is performed using an auxiliary pattern determining method discussed in Japanese Patent Application Laid-Open No. 2009-093138. FIG. 7 illustrates a main pattern 200 and an auxiliary pattern 320 obtained by the calculation. An area 300 is a range of one unit (a repeating unit) of the pattern. Herein, the calculating method for the initial arrangement of the auxiliary pattern is not limited thereto, and various calculating methods may be used.

Then, in step S114, a value (an evaluation value) of the evaluation index is calculated. In the exemplary embodiment, an exposure simulation is performed under an exposure condition that an exposure wavelength is 193 nm, NA is 1.35, an illumination shape is a cross pole shape having an outer sigma of 0.98, an inner sigma of 0.882, and an aperture angle of 60 degrees, and a polarization state is a tangential polarization. In the 18 exposure processes indicated in Table 2, a maximum line width error of the image, which is transferred to the wafer (the image surface) when the main pattern and the auxiliary pattern are irradiated, is calculated. In other words, in the 18 exposure processes, sizes of the patterns PAT1 to PAT6 on the resist are calculated, and an absolute value of the error between the size and a target size is obtained. A maximum value of the absolute value is a value of the merit function (an evaluation index) in the exemplary embodiment. As described in step S102, the target size of all the patterns PAT1 to PAT6 is 32 nm in the X direction and 50 nm in the Y direction.

Then, in step S116, it is determined whether to end or continue the calculation. If it is determined to end the calculation (YES in step S116), the process proceeds to step S120. If it is determined to continue the calculation (NO in step S116), the process proceeds to step S118.

In step S118, at least one of the sizes and positions of the main pattern and the auxiliary pattern is adjusted. In the exemplary embodiment, the size and the position of the pattern are adjusted using a downhill simplex method algorithm to improve the value of the merit function. The algorithm is not limited thereto, and the size and the position of the pattern may be adjusted using any other algorithm. Further, in the exemplary embodiment, both the size and the position are adjusted. However, only one of the size and the position may be adjusted. In addition, an arrangement of the auxiliary pattern (whether to provide the auxiliary pattern) may be adjusted. Furthermore, the position and the size of the main pattern are adjusted. However, the main pattern may not be adjusted.

After adjusting the pattern in step S118, then in step S114, the value of the merit function is evaluated using the adjusted main pattern and auxiliary pattern. Then, in step S116, it is determined whether to end the process. As described above, steps S114, S116, and S118 are repeated until it is determined to end the process to improve the value of the merit function. A condition to determine to end the process in step S116 may include a determination condition that the process ends if the number of adjustment times (that is, the number of times performing step S114) exceeds a predetermined number of times, or a determination condition that the process ends if the value of the merit function in step S114 satisfies a specific condition. In the exemplary embodiment, the condition to determine to end the process is an ending condition that the process ends when the number of adjustment times in step S114 reaches 300.

Finally, in step S120, the mask pattern is determined using the evaluation result in step S114. Specifically, the main pattern and the auxiliary pattern, each of which has a minimum value among the evaluation values calculated three hundred times in step S114, are determined as a final mask pattern, and data of the mask pattern is generated. Then, step S108 ends.

Figure 8:
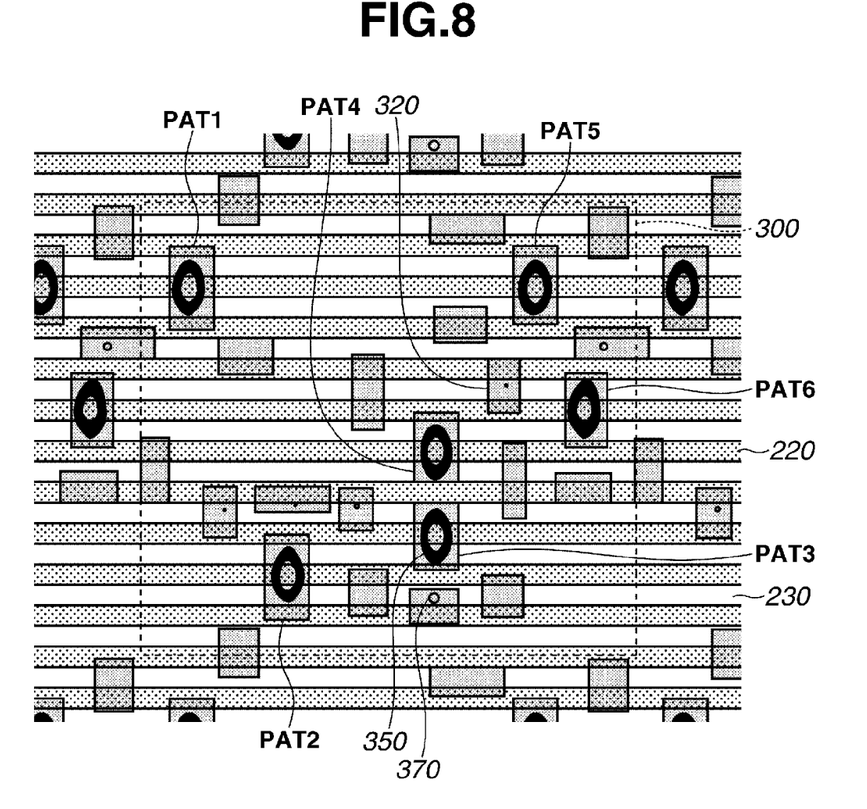
FIG. 8 is a view illustrating a mask pattern and a transfer pattern determined by a pattern generating method according to the exemplary embodiment of the present invention.

FIG. 8 illustrates a mask pattern determined by the flowchart according to the exemplary embodiment. The mask pattern includes both the main pattern 200 and the auxiliary pattern 320 whose positions or sizes are adjusted. Circle shaped curves (a curve 350 and a curve 370) are boundary lines (edges) of an image which is formed on the wafer when the mask pattern is disposed on the object surface of the exposure apparatus and exposed. Since images are similarly calculated under 18 conditions as indicated in Table 2, and the images are displayed to overlap each other, a plurality of curves is displayed to overlap each other. The curve 350 is an image of the pattern 200 (the pattern PAT3) and the curve 370 is an image of the auxiliary pattern. The L/S pattern illustrated in FIG. 2B is also illustrated. It needs to be made sure that the image of the auxiliary pattern 320 is transferred on the space part 230 of the L/S pattern, like the curve 370. As determined in the generation condition for the auxiliary pattern, even though the auxiliary pattern is transferred to the space part, the property of the device is never affected. In consideration of this, the auxiliary pattern is allowed to be transferred.

The maximum line width error, which is the evaluation value of the merit function when the mask pattern illustrated in FIG. 8 is used, is 20.1 nm. As described above, generally, in many cases, when the size of the auxiliary pattern is large, the property of the image of the main pattern is improved. In the exemplary embodiment, the auxiliary pattern is allowed to be transferred to the space part, so that the size of the auxiliary pattern is allowed to be large and image performance of the main pattern is improved. As described above, if a pattern on a lower layer of a layer, to which the main pattern is transferred, is the line and space, the auxiliary pattern above the space is determined to have a size larger than a size of the auxiliary pattern above the line so that the auxiliary pattern is transferred to the space part.

Figure 9:
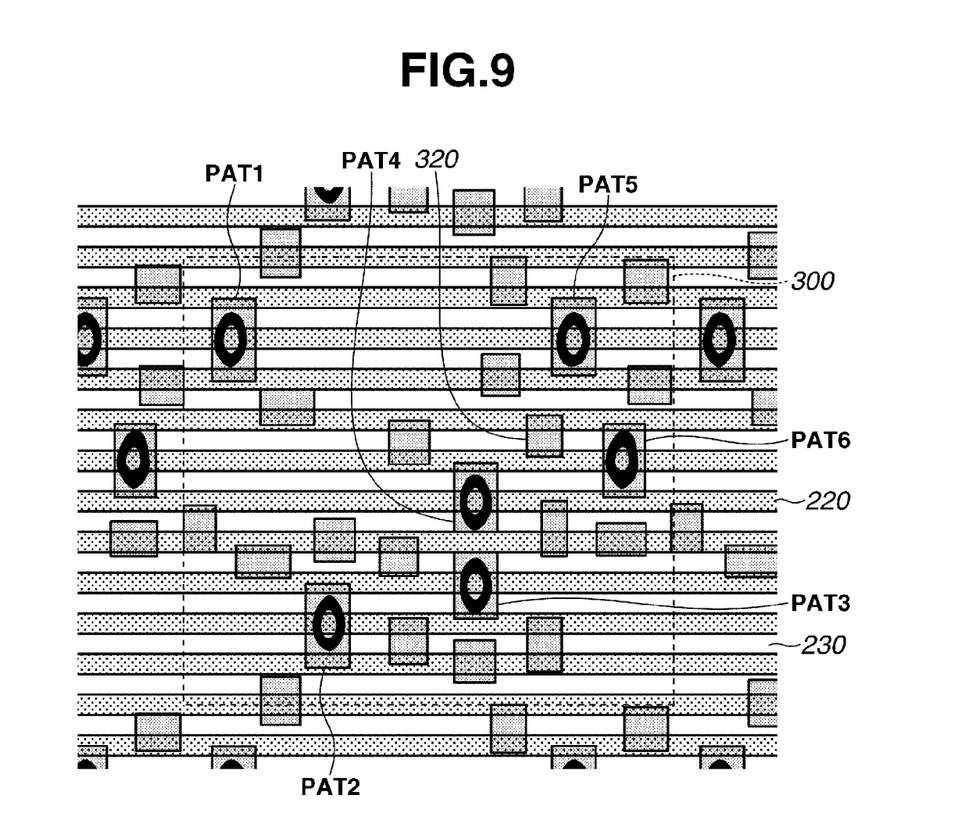
FIG. 9 is a view illustrating a mask pattern and a transfer pattern determined by a pattern generating method according to a related art.

Next, as a comparative example, FIG. 9 illustrates a mask pattern determined by a pattern generating method in the related art. FIG. 9 indicates that the position and the size are different from those of the mask pattern illustrated in FIG. 8. When the mask pattern in FIG. 9 is determined, a generation condition for the auxiliary pattern that the auxiliary pattern is never transferred is applied without considering a pattern of the lower layer, and an evaluation index based on the generation condition is used. A maximum line width error, which is the evaluation value of the merit function when the mask pattern illustrated in FIG. 9 is used, is 20.6 nm.

From these results, when the pattern generating method according to the exemplary embodiment is used, the maximum line width error becomes smaller than that of the generating method of the related art. This means that the pattern generating method according to the exemplary embodiment may reduce sensitivity to the change of the exposure process, that is, the mask error, the focal position error, and the exposure amount error at the time of exposure. Therefore, the pattern generating method according to the exemplary embodiment may improve the yield of the semiconductor device.

As described above, in the pattern generating method according to the exemplary embodiment, pattern information of a layer, which is disposed below a target layer, is considered, so that a position where the auxiliary pattern is allowed to be transferred and a position where a problem occurs in the yield of the device when the auxiliary pattern is transferred are specified. The position and the size of the auxiliary pattern are adjusted based on the above specification, so that the resolving property of the main pattern may be improved compared to the method of the related art.

Herein, the laminated structure of the wafer which is to be exposed in the exemplary embodiment is not limited to the example in FIG. 1. For example, an etch stop layer may be inserted between the pattern layer 6 and the hard mask layer 4, or other layer may be included between the hard mask layer 4 and the etching layer 2. A material for each of the layers is not limited to a specific material. For example, if the line shaped pattern 62 is formed by a self-aligned double patterning method (an SADP method), the material for the pattern 62 includes $SiO_2$ in many cases.

The exemplary embodiment has been described using a device manufacturing method which is referred to as a one-dimensional arrangement, however, the exemplary embodiment is not limited thereto. For example, a double exposure technology (a double patterning technology) is an example of the technology which has been actively studied in recent years. This technology is a technology in which, when a micropattern group is exposed (transferred) onto a wafer, the original pattern group is divided into two patterns. Then, the exposure process is performed on every divided pattern group, and the pattern groups are combined to form the original pattern group on a single layer. In this case, for example, even though an image of the auxiliary pattern in a second exposure process is transferred on the pattern transferred in a first exposure process, there may not occur problems on the device in some cases. When the pattern group in the second exposure process is regarded as a main pattern and the pattern group in the first exposure process is regarded as a background pattern, the pattern generating method according to the exemplary embodiment may be directly applied. However, the pattern generating method according to the exemplary embodiment may be applied not only to the double patterning, but also to a triple patterning and quadruple patterning.

Further, in the exemplary embodiment, in step S112, the initial arrangement of the auxiliary pattern is calculated without considering the pattern 62 on the lower layer. However, the pattern 62 on the lower layer may be considered.

In the exemplary embodiment, both the main pattern and the auxiliary pattern are hole patterns. However, the main pattern and the auxiliary pattern may not be a hole pattern. For example, the main pattern and the auxiliary pattern may be a line pattern or two-dimensional pattern, which is indicated by an L shaped pattern, a T shaped pattern, or a U shaped pattern. Alternatively, the main pattern and the auxiliary pattern may be a pattern group obtained by combining the above patterns. Further, in the exemplary embodiment, the pattern 62 on the lower layer is the L/S pattern. However, the pattern 62 may include any other pattern.

Figure 10A:
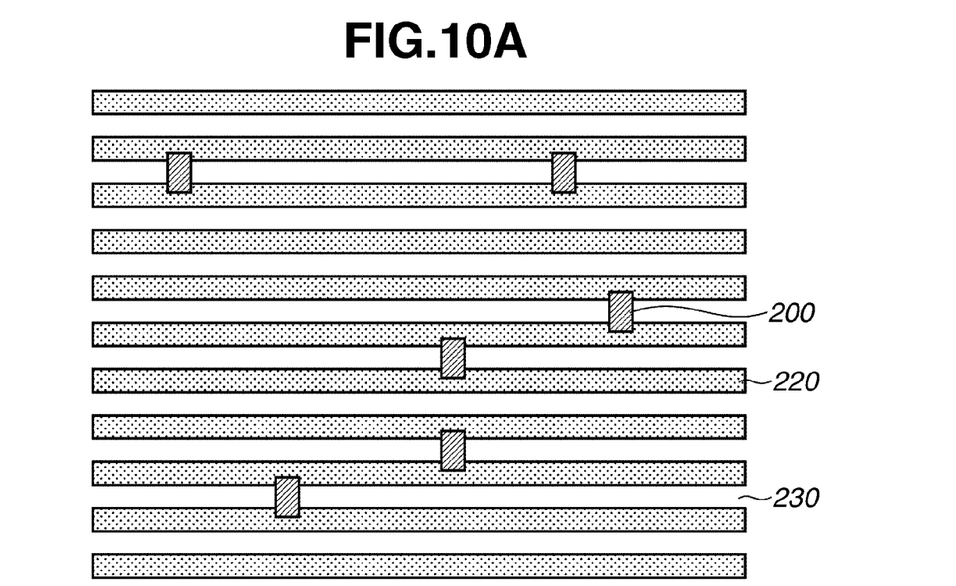
FIG. 10A is a view illustrating positions of a main pattern and a pattern of the lower layer when a dot pattern is formed on a space with a line and space (L/S) pattern and FIG. 10B is a view illustrating a processed pattern of the lower layer.
Figure 10B:
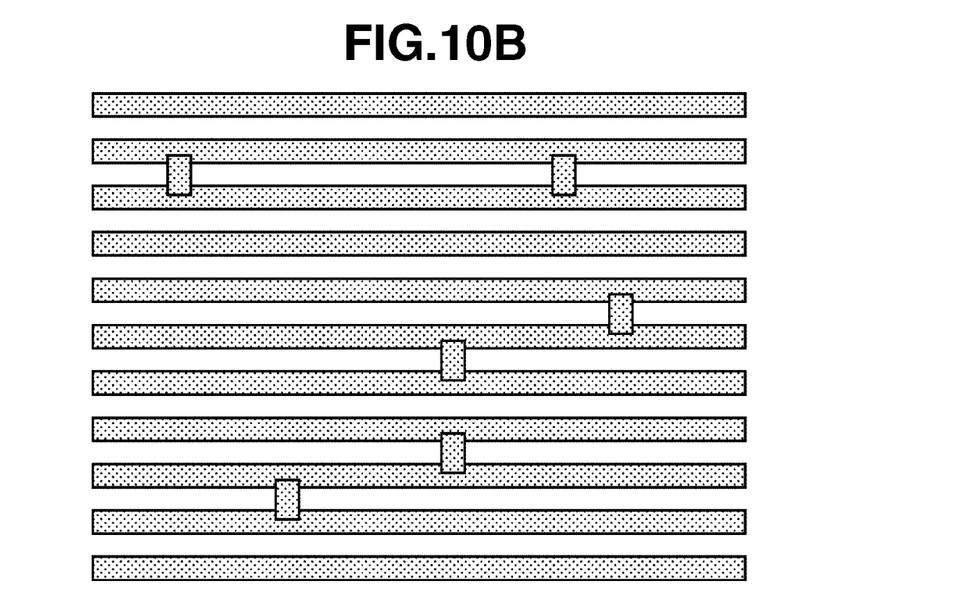

Further, in the exemplary embodiment, the hole pattern in FIG. 2A is regarded as a cut pattern (a punching pattern) which cuts the L/S pattern. However, a function of the hole pattern in the one-dimensional arrangement structure is not limited thereto. For example, as illustrated in FIG. 10A, the hole pattern 200 may be formed as a left-over pattern at a position which is moved by a half pitch in the Y direction from the position in FIG. 2C (that is, above the space part). In this case, the final finishing is as illustrated in FIG. 10B, and a dot (a pattern for connecting line parts to each other) remains between the adjacent line parts of the L/S pattern. Therefore, the hole pattern group illustrated in FIG. 10A may be referred to as a dot pattern (a dot pattern group). In many cases, the forming method in FIGS. 2A to 2D is applied to the gate process of the SRAM and the forming method in FIGS. 10A and 10B is applied to the metal process of the SRAM.

When the dot pattern in FIG. 10A is formed, the condition of generating the auxiliary pattern is that the auxiliary pattern may be transferred on the line part in FIG. 2B but is not allowed to be transferred to the space part other than a portion to which the main pattern is transferred.

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the above-described exemplary embodiment, data of a mask pattern is generated. The generated mask data is input to a mask manufacturing apparatus, such as an electron beam drawing apparatus. The mask pattern is drawn on mask blanks based on the input data, so that a mask is manufactured with the mask pattern drawn thereon.

Then, the manufactured mask is mounted on an exposure apparatus to expose a substrate, on which a photosensitive material (a resist) is applied. In the exposure apparatus, an illumination optical system irradiates the mask (a reticle) using a beam from a light source. An projection optical system projects an image of the mask pattern onto a wafer (a substrate) to expose the substrate. Then, the exposed substrate is developed. Further, other known processing is performed on the substrate, so that a semiconductor device is manufactured. The processing includes oxidization, film formation, vapor deposition, doping, planarization, etching, resist separation, dicing, bonding, and packaging.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2012-085723 filed Apr. 4, 2012, which is hereby incorporated by reference herein in its entirety.

What is claimed is:

1. A method for generating, via a computer, a mask pattern to be used for an exposure apparatus that exposes an image of the mask pattern on a substrate by irradiating a mask, the method comprising:
   obtaining data of a main pattern to be formed on the substrate, and data of a pattern of a lower layer of a layer to which the main pattern is transferred;
   setting a generation condition for an auxiliary pattern with respect to the main pattern using data of the pattern of the lower layer;
   determining the auxiliary pattern using the generation condition; and
   generating data of the mask pattern including the main pattern and the determined auxiliary pattern.

2. The method according to claim 1, wherein the generation condition includes a condition that specifies a portion, on which the auxiliary pattern is not allowed to be transferred, in an area on the pattern of the lower layer.

3. The method according to claim 1, further comprising determining the auxiliary pattern using an evaluation result, by calculating, when the main pattern and the auxiliary pattern are used as the mask pattern, an image to be transferred to the substrate while changing the auxiliary pattern, and evaluating the image based on the generation condition.

4. The method according to claim 3, further comprising evaluating the image using an evaluation index that evaluates a case where the calculated image exists in a portion, on which the auxiliary pattern is not allowed to be transferred, as an abnormal state.

5. The method according to claim 3, further comprising determining the main pattern using an evaluation result by calculating the image while changing at least one of a position and a size of the main pattern.

6. The method according to claim 1, wherein the main pattern includes a cut pattern for cutting a pattern on the lower layer.

7. The method according to claim 1, wherein the main pattern includes a pattern for connecting line parts of a pattern on the lower layer to each other.

8. The method according to claim 1, wherein, when the pattern on the lower layer of the layer to which the main pattern is transferred includes a line and space, an auxiliary pattern above a space has a size larger than a size of an auxiliary pattern above a line, so that the auxiliary pattern above the space is transferred on the space.

9. A non-transitory computer-readable storage medium storing a program that causes a computer to execute the method according to claim 1.

10. A computer for generating a mask pattern to be used for an exposure apparatus that exposes an image of the mask pattern on a substrate by irradiating a mask, the computer comprising:
    a processing unit configured to
        obtain data of a main pattern to be formed on the substrate, and data of a pattern of a lower layer of a layer to which the main pattern is transferred,
        set a generation condition for an auxiliary pattern with respect to the main pattern using data of the pattern of the lower layer,
        determine the auxiliary pattern using the generation condition, and
        generate data of the mask pattern including the main pattern and the determined auxiliary pattern.

11. A method for manufacturing a mask, the method comprising:
    generating data of a mask pattern by the method according to claim 1; and
    manufacturing the mask using the generated data of the mask pattern.

* * * * *